United States Patent [19]

Plaige

[11] Patent Number: 4,562,035
[45] Date of Patent: Dec. 31, 1985

[54] LOGIC SAFETY SYSTEM

[75] Inventor: Yves Plaige, Bures sur Yvette, France

[73] Assignees: Commissariat a l'Energie Atomique, Paris; Framatome, Courbevoie; Merlin-Gerin, Grenoble, all of France

[21] Appl. No.: 320,978

[22] Filed: Nov. 13, 1981

[30] Foreign Application Priority Data

Nov. 26, 1980 [FR] France .................. 80 25068

[51] Int. Cl.$^4$ .............................................. G21C 17/00
[52] U.S. Cl. ...................................... 376/215; 376/259
[58] Field of Search .................... 376/215, 259, 242

[56] References Cited

U.S. PATENT DOCUMENTS

| | | | |
|---|---|---|---|
| 3,223,590 | 12/1965 | Troeger | 376/259 |
| 3,424,652 | 1/1969 | Oehmann | 376/259 |
| 3,437,556 | 4/1969 | Bevilacqua et al. | 376/259 |
| 3,681,578 | 8/1972 | Stevens | 371/11 |
| 3,689,802 | 9/1972 | Waldmann | 376/215 |
| 3,735,356 | 5/1973 | Yates | 364/200 |
| 4,016,034 | 4/1977 | Musick | 376/242 |
| 4,054,486 | 10/1977 | Lefebvre et al. | 376/215 |
| 4,060,716 | 11/1977 | Pekrul et al. | 376/259 |
| 4,184,514 | 1/1980 | Ryan et al. | 376/242 |
| 4,200,864 | 4/1980 | Giller et al. | 376/215 |
| 4,363,778 | 12/1982 | Abbott | 376/215 |
| 4,434,132 | 2/1984 | Cook | 376/259 |

FOREIGN PATENT DOCUMENTS

| 2034925 | 6/1980 | United Kingdom | 376/259 |
|---|---|---|---|
| 2040522 | 8/1980 | United Kingdom | 376/259 |

OTHER PUBLICATIONS

Conf. on Reactor Operating Experience, (8/8–11/71), Denver Col., Geesey et al., pp. 35–36.
IEEE Transactions on Computers, vol. C-29, No. 3, Mar. 1980, IEEE, New York, S. Y. H. Su et al.: "A Hardware Redundancy Reconfiguration Scheme for Tolerating Multiple Module Failures", pp. 254–258.

Primary Examiner—Sal Cangialosi
Attorney, Agent, or Firm—Oblon, Fisher, Spivak, McClelland & Maier

[57] ABSTRACT

A logic safety system is disclosed having four redundant channels with each channel constituted by a logic circuit for controlling the triggering of a protective action, a logic alarm circuit connected to the control circuit and a logic inhibition circuit which makes it impossible to simultaneously inhibit several alarm circuits. Any attempt at inhibiting the alarm circuit of a second channel while an alarm circuit of a first channel is already inhibited will result in the automatic appearance of a protective action control signal at the output of the second channel regardless of the signal received at the input of the alarm circuit of the second channel.

9 Claims, 4 Drawing Figures

| | $I_1$ | $D_1$ | $S_{12}$ | $E_{11}$ | $E_{12}$ | $E_{13}$ | $ET_1$ | $ET_3$ | $ET_2$ | $S_{11}$ | $A_1$ |
|---|---|---|---|---|---|---|---|---|---|---|---|
| $C_1$ | 0 | 1 | 1 | 1 | 1 | 1 | 1 | 0 | 0 | 0 | 1 |
| $C_2$ | 0 | 0 | 1 | 1 | 1 | 1 | 0 | 0 | 0 | 0 | 0 |
| $C_3$ | 1 | 1/0 | 0 | 1 | 1 | 1 | 0 | 1 | 1 | 1 | 1 |
| $C_4$ | 0 | 1/0 | 1 | 1 | 1 | 0 | 1/0 | 0 | 0 | 0 | 1/0 |
| $C_5$ | 0/1 | 1 | 1/0 | 1 | 1 | 0 | 1/0 | 0 | 0 | 0 | 1/0 |
| $C_6$ | 1 |  | 0 | 1 | 1 | 1/0 | 0 | 0 | 1 | 1 | 1 |

FIG. 3

| | $I_1$ | $D_1$ | $S_{12}$ | $E_{11}$ | $E_{12}$ | $E_{13}$ | $OU_1$ | $ET_3$ | $OU_2$ | $ET_2$ | $S_{11}$ | $A_1$ |
|---|---|---|---|---|---|---|---|---|---|---|---|---|
| $C_1$ | 0 | 1 | 1 | 1 | 1 | 1 | 1 | 1 | 1 | 0 | 1 | 1 |
| $C_2$ | 0 | 0 | 1 | 1 | 1 | 1 | 0 | 1 | 1 | 0 | 1 | 0 |
| $C_3$ | 1 | 1/0 | 0 | 1 | 1 | 1 | 1 | 1 | 1 | 1 | 1 | 1 |
| $C_4$ | 0 | 1/0 | 1 | 1 | 1 | 0 | 1/0 | 0 | 0 | 0 | 1 | 1/0 |
| $C_5$ | 0/1 | 1 | 1/0 | 1 | 1 | 0 | 1 | 0 | 0 | 0 | 1/0 | 1/0 |
| $C_6$ | 1 |  | 0 | 1 | 1 | 1/0 | 1 | 1/0 | 1 | 1 | 1 | 1 |

FIG. 4

LOGIC SAFETY SYSTEM

BACKGROUND OF THE INVENTION

1. Field of the Invention

The present invention relates to a logic safety or security system for triggering off the protective action of a safety actuator. It more particularly applies to any emergency triggering of safety actuators controlling the shutdown of a nuclear reactor.

2. Description of the Prior Art

It is known that a nuclear reactor for example comprises a large number of devices making it possible to control its operation, said devices being called safety actuators. In the case of an accident or incident, these actuators must be triggerable with maximum rapidity, so that their protective action can stop the accident or incident in question. In such reactors, the values of a certain number of physical magnitudes such as the pressure, temperature, neutron flux, etc are measured at a certain number of points. The values of these magnitudes are then compared with reference values in different pieces of equipment. Such equipment normally supplies a logic comparison signal which is, for example, of no-zero value when the values of the physical magnitudes are in a predetermined value range corresponding to the normal operation of the reactor. When the physical magnitudes pass beyond this safety range, the equipment of the system supplies a logic output signal of e.g. zero value. The outputs of said equipment are connected to each of the four channels of the logic safety system according to the invention and which will be described in greater detail hereinafter.

It is known that logic safety systems making it possible to trigger the protective action of a safety actuator generally comprise a plurality of redundant channels connected by their outputs to inputs of a logic circuit for controlling the triggering of the protective action. This logic control circuit is designed in such a way that a protective action is triggered off whenever more than one channel supplies a signal for controlling the triggering of the protective action in response to an actuating signal received by the various channels. For example, it is possible to trigger off the protective action if p among m of the said channels emit a triggering signal. Generally, p is equal to 2 and m is equal to 4 if it is desired to be able to inhibit one channel of the system for testing purposes. For the purposes of describing the invention, it will be assumed that the system has 4 redundant channels and that the protective action is triggered off from signals having at least two channels. Positive safety circuits are also well known to specialists dealing with safety problems. The so-called positive safety of a circuit is its capacity to evolve in the sense of initiating the action for which it has been designed in the case of "safe" breakdowns, the number of non-safe breakdowns being reduced to a value very close to zero. It is obvious that such circuits can be used not only in the nuclear field, but in any other field requiring the triggering off of protective actions.

It is also known that certain logic safety systems comprise for each of the control channels a logic alarm circuit making it possible to actuate the control channel when it receives an alarm signal at its input, as well as a logic circuit for inhibiting this logic alarm circuit making it possible, when it receives an inhibition control signal, to isolate the control channel from the logic circuit controlling the triggering of the protective action. This inhibition of the control channel is necessary in logic safety systems, e.g. for testing circuits upstream of the logic actuating circuit. These upstream circuits may be, for example, signal amplification and processing chains connected to sensors. These sensors make it possible to determine physical parameters characterizing the operation of an installation incorporating actuators, whose protective action must be triggered off in the case of an incident. This possible inhibition of the control channels in a logic safety system, although necessary for testing purposes, must not be carried out within taking precautions. In a so-called 2/4 safety circuit, it is possible to envisage the inhibition of one of the channels for inspection or maintenance purposes. However, it is not permissible to simultaneously inhibit two of the four channels. Thus, any logic safety system must respect the criterion of a single failure imposing that the protective action is triggered off in the case of an incident. The inhibition of a single channel in a 2/4 safety circuit makes it possible to respect this criterion, but the inhibition of two channels or, a fortiori, three channels must not be permitted. Thus, if two channels were inhibited and a fault occurred (non-safe breakdown) in one of the two remaining channels, the safety system would not trigger off the protective action if this was required. Although it is known to operate logic safety circuits of the 2/4 type having four redundant channels and comprising logic alarm and inhibition circuits, it is not known in the case of such 2/4 circuits how to simply and reliably prevent the inhibition of several channels.

BRIEF SUMMARY OF THE INVENTION

The problem of the invention is to obviate this disadvantage and make it possible to provide a logic safety system for triggering the protective action of an actuator. This logic safety system comprises four redundant channels, each constituted by a logic circuit for controlling the triggering of the protective action, a logic alarm circuit connected to the control circuit and a logic inhibition circuit by means of which it is impossible to simultaneously inhibit several alarm circuits. As will be shown hereinafter, any attempt at inhibiting the alarm circuit of a second channel, whilst the alarm circuit of a first channel is already inhibited, automatically leads to the appearance of a protective action control signal at the output of said second channel, no matter what the signal received at the input of the alarm circuit of said second channel.

The present invention therefore relates to a logic safety system for triggering off the protective action of a safety actuator, comprising a whole number m of redundant channels for the controlling of the triggering of the protective action, said channels being connected by outputs to the inputs of a logic circuit for controlling the triggering of the protective action able to trigger off said action whenever at least two of the m channels have supplied a protective action triggering control signal in response to an alarm signal received by at least the two said channels, wherein each of the channels comprises a logic alarm circuit able to receive the alarm signal at one input, a logic circuit for inhibiting the logic alarm circuit able to receive at a control input an inhibition control signal of the logic alarm circuit, said inhibition circuit being connected to an inhibition input of the alarm circuit able to receive an inhibition signal also from the corresponding channel, the logic alarm and inhibition circuits of each channel being constituted and connected in such a way that when the logic inhibition circuit of a first channel from among all the channels receives at its inhibition control input an inhibition control signal, whilst said signal has already been received by an inhibition control input of a logic inhibition circuit of a second channel from among all the channels, the logic inhibition circuit of said first channel applies, by its safety output to a safety input of the corresponding alarm circuit, a safety signal which causes the appearance of a signal controlling the triggering of the protective action at an input of the alarm circuit corresponding to the output of said first channel, no matter what the signals received at the alarm inputs of the alarm circuits of the other channels.

BRIEF DESCRIPTION OF THE DRAWINGS

The invention is described in greater detail hereinafter relative to non-limitative embodiments and the attached drawings, wherein show:

FIG. 3 a table giving the values of the logic signals appearing at characteristic points of the system of FIG. 1.

FIG. 4 a table giving the logic values of the signals appearing at characteristic points of the system of FIG. 2.

DETAILED DESCRIPTION OF THE PREFERRED EMBODIMENTS

Figure 1:
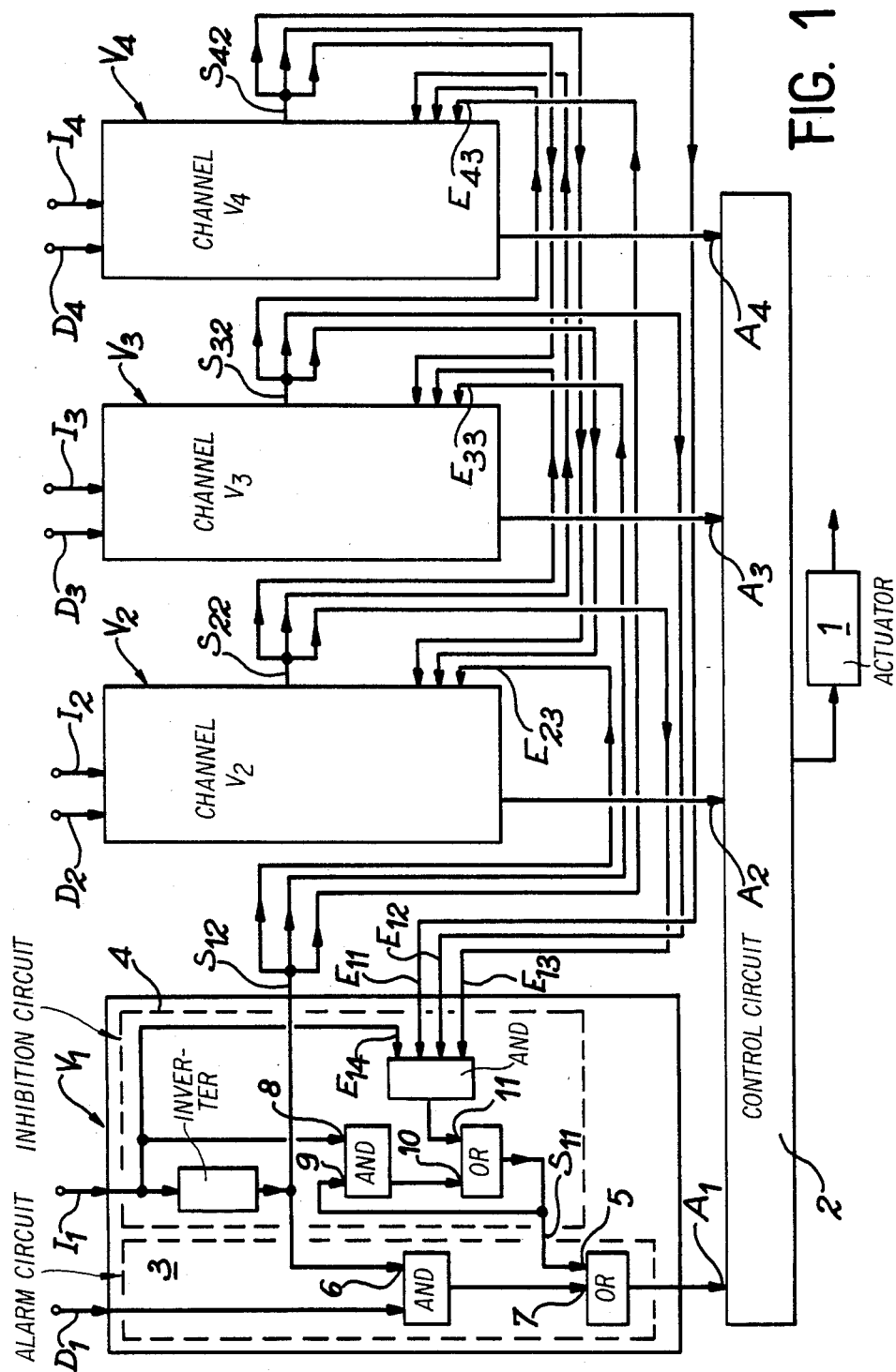
FIG. 1 diagrammatically, a first embodiment of a logic safety system according to the invention.

FIG. 1 diagrammatically shows a first embodiment of a logic safety system according to the invention. This logic system makes it possible to trigger off the protective action of a safety actuator 1 which acts, for example, on the operation of an installation in the case of a failure or fault therein. In the manner indicated hereinbefore, said fault can be located by signals resulting from the comparison of physical parameters supplied by not shown sensors and which are compared with reference parameters. These comparison signals reach the alarm inputs $D_1$, $D_2$, $D_3$, $D_4$ of different redundant channels $V_1$, $V_2$, $V_3$, $V_4$ of the logic safety system according to the invention. These channels are connected by outputs $A_1$, $A_2$, $A_3$, $A_4$ to the inputs of a logic circuit 2 controlling the triggering of the protective action. This logic circuit can be a positive safety circuit able to trigger on actuator 1 when at least two of the four channels have supplied a protective action triggering control signal to triggering control circuit 2 in response to an actuating signal received at the alarm inputs $D_1$, $D_2$, $D_3$, $D_4$ of said channels.

In safety systems, it is agreed that the signals reaching the alarm inputs $D_1$ to $D_4$ of the different channels normally have a logic state 1 in the absence of faults indicated by the sensors. One or more of the logic signals from the upstream sensors will be at logic state 0 if one or more faults are indicated.

The following description corresponds to the choice of this convention regarding logic states 0 and 1. If the opposite convention was adopted for the complete protective installation, the general construction of the system would remain the same, the modification only relating to the internal logic elements by applying rules which are well known to the Expert in order to pass from the aforementioned logic (normal state 1, triggering state 0) to the complementary logic.

In the drawing $I_1$, $I_2$, $I_3$, $I_4$ designate the control inputs making it possible to supply an inhibition control signal to each of the channels. Each of the channels comprises a logic alarm circuit 3 and a logic inhibition circuit 4. Inhibition circuit 4 acts on alarm circuit 3, in the manner to be shown hereinafter. In the absence of inhibition of each of the channels, the channel inhibition control inputs $I_1$ to $I_4$ are normally in logic state 0. When one of these channels has to be inhibited in order, for example, to test the amplification and processing chain, as well as the sensor positioned upstream, an inhibition control signal from the logic alarm circuit of logic level 1 is applied to the inhibition control input of the corresponding channel. In each of the channels, one output $S_{12}$ of inhibition circuit 4 is connected to one inhibition input 6 of alarm circuit 3. This inhibition input receives an inhibition signal if an inhibition control signal of logic level 1 is applied, for example, to inhibition control input $I_1$.

It is obvious that the various channels are identical and a detailed description will only be given of the structure and operation of channel $V_1$. Logic alarm circuit 3 and logic inhibition circuit 4 are constituted and connected in such a way that when the logic inhibition circuit of a first channel, such as e.g. channel $V_1$ receives an inhibition signal of logic level 1 at its inhibition control input $I_1$, whilst an inhibition control signal has already been received by an inhibition control input $I_2$ of e.g. a second channel $V_2$, the logic inhibition circuit 4 of the first channel $V_1$ acts on logic alarm circuit 3 in such a way that a protective action triggering signal appears at output $A_1$ of said circuit. This signal for triggering the protective action in safety systems is generally of logic level 0. In this case and as will be shown in greater detail hereinafter, the logic inhibition circuit 4 of channel $V_1$ applies a safety signal by a safety output $S_{11}$ to a safety input 5 of alarm circuit 3 and this leads to the appearance at the output $A_1$ of the alarm circuit of a protective action triggering control signal. The inhibition circuit 4 of each channel comprises three other safety inputs $E_{11}$, $E_{12}$, $E_{13}$.

In FIG. 1, the three safety inputs $E_{11}$, $E_{12}$, $E_{13}$ are respectively connected to the outputs $S_{42}$, $S_{32}$, $S_{22}$ of the not shown inhibition circuits of the three other channels. In this way, the inhibition circuit 4 of the first channel $V_1$ applies another safety signal by its output $S_{12}$ connected to input $E_{21}$ among the three safety inputs $E_{21}$, $E_{22}$, $E_{23}$ of the not shown inhibition circuit of another channel.

As will be shown hereinafter, this signal leads to the appearance of a protection triggering signal at output $A_2$ of said channel if the alarm circuit 3 of the first channel has already been inhibited. This triggering signal at output $A_2$ is at logic level 0 according to the conventions described hereinbefore.

In this first embodiment of the system according to the invention, each logic alarm signal 3 comprises an alarm gate $AND_1$ having two inputs (6,$D_1$). As indicated hereinbefore, input $D_1$ can receive an alarm signal of logic level 0, whilst another input 6 constitutes the inhibition input of the alarm circuit 3. Alarm circuit 3 also comprises an alarm gate $OR_1$ having two inputs 5, 7. Input 7 is connected to the output of gate $AND_1$, whilst input 5 constituting the safety input of the alarm circuit is connected to the safety output $S_{11}$ of the inhibition circuit. The output of gate $OR_1$ constitutes the output $A_1$ of alarm circuit 3.

The logic inhibition circuit 4 of each channel comprises an inverter INV, whose input $I_1$ is able to receive the inhibition control signal of logic level 1. Output $S_{12}$ of said inverter is connected, in the manner stated hereinbefore, to the inhibition input 6 of the alarm circuit and to the safety inputs $E_{ij}$ of the other channels, such as inputs $E_{23}$, $E_{33}$, $E_{43}$ of channels $V_2$, $V_3$, $V_4$. The logic inhibition circuit 4 also comprises an inhibition gate $AND_2$ with two inputs 8, 9. The first input 8 is connected to input $I_1$ of inverter INV. An inhibition gate $OR_2$ with two inputs 10, 11 is connected on the one hand to the output of gate $AND_2$ and on the other to the output of another gate $AND_3$ having four inputs $E_{11}$, $E_{12}$, $E_{13}$, $E_{14}$, the latter being connected to the inhibition control input $I_1$. Output $S_{11}$ of gate $OR_2$ is connected on the one hand to the other input 9 of gate $AND_2$ and on the other to the safety input 5 of gate $OR_1$ of alarm circuit 3. Gate $AND_3$ has four inputs, three of the said inputs $E_{11}$, $E_{12}$, $E_{13}$ form the inhibition circuit safety inputs. As stated hereinbefore, input $E_{14}$ of this gate is connected to input $I_1$ of inverter INV, whilst the three other inputs $E_{12}$, $E_{13}$, $E_{14}$ are respectively connected to outputs $S_{22}$, $S_{32}$, $S_{42}$ of inverters of the inhibition circuits of the other channels. The looped circuit formed between output $S_{11}$ and gate $OR_2$ and input 9 of gate $AND_2$ makes it possible to make inhibition circuit 4 independent of the state of inputs $E_{11}$, $E_{12}$, $E_{13}$, as soon as the inhibition of the channel becomes effective. The operation of the aforementioned system will be described in greater detail hereinafter.

Figure 2:
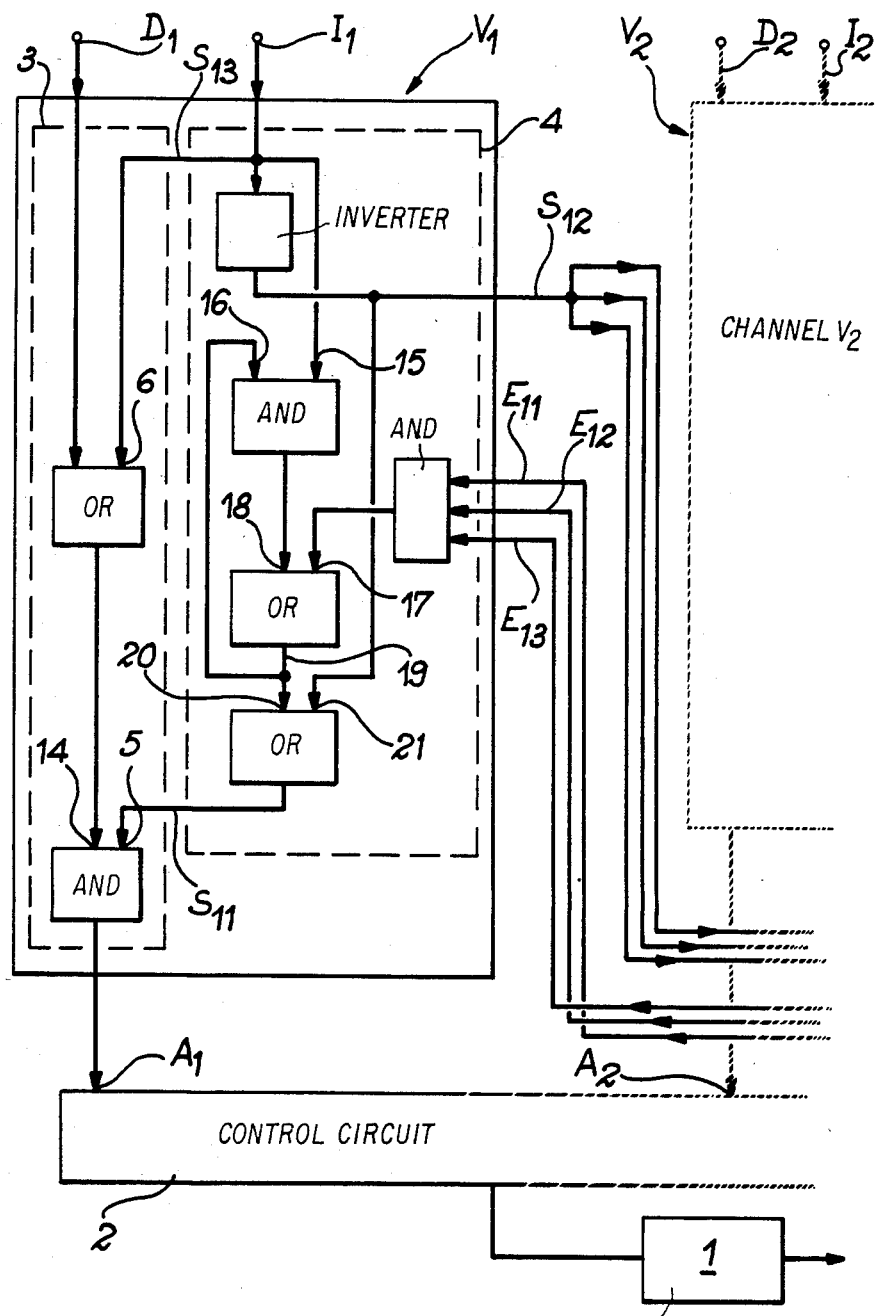
FIG. 2 diagrammatically, a second embodiment of a logic safety system according to the invention.

FIG. 2 diagrammatically shows another embodiment of a logic safety system according to the invention. FIG. 2 only shows two of the redundant channels $V_1$, $V_2$ among the four logic system channels. Channel $V_1$ is shown in greater detail in FIG. 2. Each of the channels, which are identical to $V_1$, comprises an input $D_1$ able to receive an alarm signal making it possible to trigger a protective action of actuator 1, which rapidly intervenes in the operation of an installation which is not shown in the drawing. As in the previously described embodiments, triggering is brought about by means of the triggering control circuit 2.

As in the first embodiment, the system also comprises an inhibition control input $I_1$ making it possible to isolate the corresponding channel of device 1 in order, for example, to test the amplification and processing chain, as well as the sensor positioned upstream of said channel. Each of the channels has a logic alarm circuit 3 and an inhibition circuit 4. In this embodiment of the system according to the invention, the logic alarm circuit 3 is able to receive an alarm signal at its input $D_1$ of logic level 0, whilst logic inhibition circuit 4 is able to receive an inhibition control signal of logic level 1 at its input $I_1$. A connection $S_{13}$ connects inhibition circuit input $I_1$ to an inhibition type input 6 of alarm circuit 3. This inhibition input receives an inhibition signal. Logic circuits 3 and 4 are constituted and connected in such a way that when logic inhibition circuit 4 of e.g. channel $V_1$ receives at its input $I_1$ an inhibition control signal, whilst said signal has also been received by an input $I_2$ of the logic inhibition circuit of another channel (such as e.g. $V_2$), logic inhibition circuit 4 of channel $V_1$ controls the logic alarm circuit 3 of said channel in such a way that a protective action triggering signal appears at output $A_1$.

To this end, the logic inhibition circuit 4 applies a safety signal by means of a safety output $S_{11}$ to a safety input 5 of alarm circuit 3 and this leads to the appearance at input $A_1$ of said circuit of the protective action triggering control signal, which is applied to the logic control circuit 2.

In this second embodiment of the system according to the invention, the inhibition circuit on each channel comprises three safety inputs $E_{11}$, $E_{12}$ and $E_{13}$. On output $S_{12}$ of the inhibition circuit is respectively connected to one of the three safety inputs $E_{23}$, $E_{33}$, $E_{43}$ of the inhibition circuits of the three other channels. The inhibition circuit 4 of the first channel thus applies by its output connected to one of the three safety inputs of the inhibition circuits of the other channels, a further safety signal which brings about the triggering of the protective system on any other channel where an attempt has been made at inhibition, no matter what the signal present at the alarm input of said channel.

In this embodiment of the system according to the invention, logic alarm circuit 3 comprises a gate $OR_1$ having two inputs 6, $D_1$. One of these inputs may receive an alarm signal, whilst the other input 6 constitutes the inhibition control input of alarm circuit 3. This circuit also comprises a gate $AND_1$ having two inputs 5, 14. Input 14 is connected to the output of gate $OR_1$, whilst inputs 5 constitute the safety input of the alarm circuit 3. This safety input is connected to safety output $S_{11}$ of inhibition circuit 4. Output $A_1$ of gate $AND_1$ forms the output of alarm circuit 3 of the considered channel $V_1$.

Logic inhibition circuit 4 has for each channel an inverter INV, whereof one input $I_1$ is able to receive the inhibition control signal. This input is connected to the inhibition control input of gate $OR_1$ of alarm circuit 3. Output $S_{12}$ of said inverter forms, in the manner indicated hereinbefore, an inhibition circuit safety output. The latter is connected to each of the three safety inputs of the inhibition circuits of the other channels.

The inhibition circuit also comprises a gate $AND_2$ having two inputs 15, 16. One input 15 of said gate is connected to input $I_1$ of inverter INV. A first gate $OR_2$ having two inputs 17, 18 is connected by input 18 to the output of gate $AND_2$. Gate 19 of gate $OR_2$ is connected on the one hand to input 16 of gate $AND_2$ and on the other to input 20 of a second gate $OR_3$ having two inputs 20, 21. Input 21 of gate $OR_3$ is connected to output $S_{12}$ of inverter INV. Output $S_{11}$ of said second gate $OR_3$ is connected to input 13 of gate $AND_1$ of alarm circuit 3.

Finally, the inhibition circuit comprises a gate $AND_3$ having three inputs $E_{11}$, $E_{12}$, $E_{13}$. These three inputs form the safety inputs of the inhibition circuit, whilst the output of said gate $AND_3$ is connected to input 17 of the first gate $OR_2$ of the inhibition circuit. Output $S_{12}$ of inverter INV is connected, in the manner indicated hereinbefore, to each of the safety inputs of the inhibition circuits of the other channels. In the same way, the other safety outputs of the three other channels are respectively connected to these three safety inputs $E_{11}$, $E_{12}$, $E_{13}$ of the inhibition circuit of the first channel.

FIG. 3 is a table of the logic values appearing at characteristic points of the safety system according to the first embodiment of the invention shown in FIG. 1. In this table, values 0 or 1 designate the logic state of the signals present at input $I_1$ of inhibition circuit 4, at input $D_1$ of alarm circuit 3, at output $S_{12}$ of the inhibition circuit, at the safety inputs $E_{11}$, $E_{12}$, $E_{13}$ of said circuit, at the output of each of the gates $AND_1$, $AND_3$, $AND_2$, at output $S_{11}$ controlling the safety input of alarm circuit 5 and finally at output $A_1$ of channel $V_1$. $C_1$, $C_2$, $C_3$, $C_4$ $C_5$, $C_6$ designate different operating states of the previously described safety system.

Case $C_1$ corresponds to normal operation of the installation under surveillance connected to the output of actuator 1. It is assumed in this case that no alarm circuit has been received at input $D_1$ of channel $V_1$ and that no inhibition control signal has been received at input $I_1$ of the inhibition circuit of said channel, as well as at the inhibition inputs of the other channels. In this case, input $I_1$ is at logic level 0, whilst input $D_1$ is at logic level 1. The operation of the different AND and OR gates, as well as the operation of inverter INV are well known in the art and it is easy to deduce therefrom the logic state of the signals appearing at the characteristic points defined hereinbefore. All the safety inputs $E_{11}$, $E_{12}$, $E_{13}$ of the inhibition circuit receive logic signals of level 1 from the inhibition circuits of the other channels, because none of the said channels receives an inhibition control signal. Output $A_1$ of channel $V_1$ is then at logic level 1. This level corresponds to the absence of a protective action triggering signal at the corresponding input of the logic control circuit 2.

Case $C_2$ corresponds to the transmission of an alarm signal to input $D_1$ of channel $V_1$. This signal corresponds to a logic level 0 at input $D_1$, whilst it is assumed that no inhibition signal has been received by said channel because its input $I_1$ is at level 0. It is also assumed that none of the other channels is received as an inhibition control signal because the safety inputs $E_{11}$, $E_{12}$, $E_{13}$ are at logic level 1. In this case, channel $V_1$ fulfils its function and its output $A_1$ is at level 0, which corresponds to the application of a protective action triggering signal to the corresponding input of logic control circuit 2.

Case $C_3$ corresponds to the absence and then the application of an alarm signal to input $D_1$ of channel $V_1$ (logic signal of level 1 at input $D_1$ of said channel, then logic signal of level 0). It is also assumed that a logic inhibition control signal is applied to input $I_1$ (level 1), whilst no other inhibition control signal has been received from the other channels, which corresponds to logic states of level 1 at the safety inputs $E_{11}$, $E_{12}$, $E_{13}$ of channel $V_1$. In this case, even if an alarm signal is applied to input $D_1$, the signal at output $A_1$ of channel $V_1$ remains at level 1, which corresponds to the absence of a protective action triggering signal at the corresponding input of logic control circuit 2. In summarizing, it can be stated that the application of an inhibition control signal to one of the channels, whilst all the other channels are not inhibited, maintains the output of the inhibited channel at logic level 1 (absence of protective action triggering), no matter what the signal applied to the alarm control input of said channel.

Case $C_4$ corresponds to the absence and then the application of an alarm signal (level 1, then level 0) to input $D_1$ of channel $V_1$, said channel not being inhibited (level 0 at inhibition control input $I_1$). It is assumed that one of the other channels (such as $V_2$) has received an inhibition control signal, which means a logic signal of level 0 at safety input $E_{13}$ of channel $V_1$. Channels $V_3$ and $V_4$ are assumed not to be inhibited (level 1 at safety inputs $E_{11}$, $E_{12}$). In this case, the application of an alarm signal (passage from level 1 to level 0) to input $D_1$ of channel $V_1$ leads to the appearance of a protection triggering signal (passage from level 1 to level 0) at output $A_1$ of channel $V_1$.

Case $C_5$ corresponds to the inhibition of e.g. channel $V_2$, which means that there is a signal of level 0 at safety input $E_{13}$ and then the attempted inhibition of channel $V_1$ (passage of $I_1$ from level 0 to level 1). In this case, output $A_1$ of channel $V_1$ passes from level 1 to level 0 (triggering off protective action). To summarize this case, it can be stated that the application of an inhibition signal to one of the channels, when another channel is already inhibited, leads to the appearance of a protective action triggering signal at the output of the channel, whose inhibition has been attempted.

Case $C_6$ corresponds to the inhibition of channel $V_1$ ($I_1$ at logic level 1), then the inhibition of channel $V_2$ (safety input $E_{13}$ passing from level 1 to level 0). It has been seen hereinbefore that in such a case as channel $V_1$ is the channel which was inhibited first, the output of channel $V_2$ applies a protection triggering signal to logic circuit 2. Output $S_{22}$ of channel $V_2$ passes from level 1 to level 0 in forming the other channels of the attempted inhibition of channel $V_2$, which has produced the triggering signal. In the table, this level change is visible in the column corresponding to safety input $E_{13}$ of channel $V_1$. Output $A_1$ of channel $V_1$ remains at logic level 1 (absence of protective action triggering on said channel), even if input $D_1$ of said channel receives an alarm signal (signal applied at $D_1$ passing from level 1 to level 0). To summarize this case, it can be stated that when a first channel is inhibited, the attempted inhibition of another channel leads to the triggering of the protective action at the output of said other channel, whilst the output of the first inhibited channel does not trigger off any protective action (logic level 1 at said output), even if an alarm signal is applied to its input.

The table of FIG. 4 represents for the same operating cases $C_1$ to $C_6$ referred to hereinbefore, the logic levels of the signals appearing at different characteristic points of the system accordig to the invention and as represented in FIG. 2. Detailed comment will not be made on this table. $OR_1$, $AND_3$, $OR_2$, $OR_3$ designate the logic levels of the output signals of the corresponding gates.

In the logic safety system described hereinbefore, each logic inhibition control circuit permanently knows the state of the inhibitions on the other redundant channels of the system. For safety reasons, it is advantageous to choose by convention active signals for the transmission between the different channels of inhibition data in such a way that any interruption or break to a connection between the logic inhibition circuits of the different channels can be likened to an inhibition. Thus, such a break or interruption does not render the security of the safety system defective. The use of positive safety dynamic logic circuits in the formation of the urgent action control circuit 2 makes it possible to obtain a system with a very high level of operational reliability.

What is claimed is:

1. A logic safety system for triggering off the protective action of a safety actuator, comprising:

a whole number m of redundant channels for the controlling of the triggering of the protective action, said channels being connected by respective outputs to the inputs of a logic circuit for controlling the triggering of the protective action for triggering off said action whenever at least two of the m channels have supplied a protective action triggering control signal in response to an alarm signal received by at least the two said channels, wherein each of the said channels comprises a logic alarm circuit receiving the alarm signal at one input, a logic inhibiting circuit for inhibiting the logic alarm circuit and for receiving at a control input an inhibition control signal, said inhibition circuit being connected to an inhibition input of said alarm circuit for receiving an inhibition signal output by said inhibition circuit and wherein said inhibition circuit further comprises a safety means for outputting a first safety signal to a safety input of said alarm circuit, whereby when the logic inhibition circuit of one of said channels receives at its inhibition control input an inhibition control signal simultaneously with an inhibition control signal being received by an inhibition control input of another one of said channels, said safety means of said inhibition circuit of said one channel applies said first safety signal to said safety input of said alarm circuit thereby providing a trigger control signal for controlling the triggering of the protective action at an input of the alarm circuit corresponding to the output of said one channel.

2. A logic system according to claim 1, wherein the inhibition circuit on each channel also comprises m-1 safety inputs respectively connected to safety outputs of the inhibition circuits of the m-1 other channels, the inhibition circuit of each channel thus applying by a safety output respectively connected to one of the m-1 safety inputs on each inhibition circuit of the other channels, another safety signal indicating the inhibited or non-inhibited state of the alarm circuit of each channel.

3. A system according to claim 2, wherein each logic alarm circuit comprises an alarm gate $AND_1$ having two inputs, one of the said inputs being able to receive the alarm signal, whilst the other input forms the inhibition input of said circuit, and an alert gate $OR_1$ having two inputs, one of the said inputs being connected to an output of gate $AND_1$, whilst another input of gate $OR_1$ forms the safety input of the alarm circuit connected to the safety output of the inhibition circuit, the output of said gate $OR_1$ forming the output of the alarm circuit connected to the logic control circuit.

4. A system according to claim 3, wherein each logic inhibition circuit comprises an inverter, whereof one input is able to receive the inhibition control signal, one output of said inverter being connected to an input of alarm gate $AND_1$ forming the inhibition input of the alarm circuit, an inhibition gate $AND_2$ having two inputs, whereof a first input is connected to the input of the inverter, an inhibition gate $OR_2$ having two inputs, whereof one is connected to the output of the inhibition gate $AND_2$ having two inputs, the output of said gate $OR_2$ being connected on the one hand to the other input of the inhibition gate $AND_2$ having two inputs and on the other hand to the safety input of alarm gate $OR_1$, and a gate $AND_3$ having m inputs, m-1 of said inputs constituting the m-1 safety inputs of the inhibition circuit, the output of said gate $AND_3$ with m inputs being connected to the other input of the inhibition gate $OR_2$, the mth input of gate $AND_2$ having four inputs being connected to the output of the inverter, whilst the m-1 other inputs of said gate are respectively connected to the outputs of the inverters of the inhibition circuits of the three other channels.

5. A system according to claim 1, wherein the inhibition circuit of each channel comprises m-1 safety inputs, an output of the inhibition circuit of each channel being connected respectively to one of the m-1 safety inputs of the inhibition circuits of the other channels, the inhibition circuit of one of the channels thus applying by its output connected to one of the three safety inputs of the inhibition circuits of the other channels, another safety signal indicating the inhibited or non-inhibited state of the alarm circuit on each channel.

6. A system according to claim 5, wherein each logic alarm circuit comprises an alarm gate $OR_1$ having two inputs, one of the inputs being able to receive the alarm signal, whilst the other input forms the inhibition input of said circuit, and an alarm gate $AND_1$ having two inputs, one of these inputs being connected to one output of gate $OR_1$, whilst another input of said gate $AND_1$ forms the safety input of the alarm circuit connected to the safety output of the inhibition circuit, the output of said gate $AND_1$ constituting the output of the alarm circuit connected to the logic control circuit.

7. A system according to claim 6, wherein each logic inhibition circuit has an inverter, whereof one input is able to receive the inhibition control signal, said input also being connected to the inhibition input of alarm gate $OR_1$, an inhibition gate $AND_2$ having two inputs, whereof one is connected to the inverter input, a first inhibition gate $OR_2$ having two inputs, whereof one is connected to the output of gate $AND_2$ having two inputs and whereof the output is connected to the other input of gate $AND_2$ having two inputs, a second inhibition gate $OR_3$ with two inputs, whereof one is connected to the output of the first gate $OR_2$, the output of said second inhibition gate $OR_3$ constituting the safety output of the inhibition circuit connected to the other safety input of alarm gate $AND_1$, a gate $AND_3$ with m-1 inputs constituting the m-1 other safety inputs of the inhibition circuit, the output of said gate $AND_3$ being connected to the other input of the first inhibition gate $OR_2$, the other input of the second inhibition gate $OR_3$ being connected to the output of the inverter, the m-1 inputs of gate $AND_3$ being connected respectively to the other outputs of the inverters of the inhibition circuits of the three other channels in order to receive said other safety signal.

8. A system according to claim 1, wherein the logic control actuation circuit is of the dynamic logic positive safety type.

9. A system according to claim 1, wherein it comprises four redundant channels.

* * * * *